(12) United States Patent  
Buckley, Jr.

(10) Patent No.: US 6,490,711 B2
(45) Date of Patent: Dec. 3, 2002

(54) METHOD FOR CREATING A DESIGN VERIFICATION TEST BENCH

(75) Inventor: Delmas Robert Buckley, Jr., Palo Alto, CA (US)

(73) Assignee: Yardstick Research, LLC, Menlo Park, CA (US)

( * ) Notice: Subject to any disclaimer, the term of this patent is extended or adjusted under 35 U.S.C. 154(b) by 163 days.

(21) Appl. No.: 09/740,632

(22) Filed: Dec. 18, 2000

(65) Prior Publication Data

US 2002/0078424 A1 Jun. 20, 2002

(51) Int. Cl.[7] .............................. G06F 17/50; G06F 9/45
(52) U.S. Cl. ................................................. 716/5; 716/4
(58) Field of Search ........................................ 716/5, 4

(56) References Cited

U.S. PATENT DOCUMENTS

| | | |
|---|---|---|
| 5,812,416 A | 9/1998 | Gupte et al. |
| 5,903,475 A | 5/1999 | Gupte et al. |
| 5,923,867 A | 7/1999 | Hand |
| 5,953,519 A | 9/1999 | Fura |
| 5,963,454 A | 10/1999 | Dockser et al. |
| 6,026,226 A | 2/2000 | Heile et al. |
| 6,076,180 A | 6/2000 | Meyer |
| 6,077,304 A | 6/2000 | Kasuya |
| 6,083,269 A * | 7/2000 | Graef et al. .................. 703/14 |
| 6,128,025 A | 10/2000 | Bright et al. |
| 6,141,630 A | 10/2000 | McNamara et al. |
| 6,161,211 A | 12/2000 | Southgate |
| 6,263,483 B1 * | 7/2001 | Dupenloup .................. 716/18 |
| 6,289,498 B1 * | 9/2001 | Dupenloup .................. 716/18 |

OTHER PUBLICATIONS

P.C. Ward et al., Behavioral Fault Simulation in VHDL, ACM/IEEE Design Automation Conference, pp. 587–593, Jun. 1990.*

S. Kapoor et al., An Automatic Test Bench Generation System, 1994 VHDL International Users Forum, pp. 8–17, May 1994.*

Corno, et al., "Automatic Test Bench Generation for Validation of RT–Level Descriptions" IEEE Design Automation and Test Conference, Paris, Mar. 2000.

* cited by examiner

Primary Examiner—Vuthe Siek
Assistant Examiner—A. M. Thompson
(74) Attorney, Agent, or Firm—Robert Buckley

(57) ABSTRACT

A method for creating test benches for digital circuit design verification (1) partitions a design for purposes of test bench creation according to circuit type, (2) identifies circuit types and creates packaged testing strategies, (3) uses ATPG techniques to create comprehensive test sequences based on the circuit type classifications, and (4) incorporates the ATPG-produced test stimuli and expected responses into the test bench templates.

15 Claims, 1 Drawing Sheet

METHOD FOR CREATING A DESIGN VERIFICATION TEST BENCH

FIELD OF THE INVENTION

The invention relates to digital design verification, and more specifically to a method for creating a design verification test bench using automatic test pattern generation ("ATPG") and test strategies based on circuit-type classifications.

BACKGROUND OF THE INVENTION

Test benches for very large scale integrated circuit ("VLSI") designs are difficult and time consuming to create. Additionally, the complexity of circuits is not being fully explored during (non-formal) verification testing. The techniques now being used to create test benches rely on an application of human intuition in the form of waveform editing and test benches written in a hardware description language ("HDL"), such as Verilog and VHDL.

These intuitive approaches suffer from the limitations that once plagued manufacturing test generation—the complexity overwhelms most human designers. Testing based on intuition is therefore generally inadequate, is prone to human design error, and takes much too long to create. The efforts of electronic design automation ("EDA") tool designers have been directed primarily at helping the designer to produce larger designs in reasonably short time frames. Only a limited effort has been directed at helping the designer or test bench creator to create more useful test benches in less time. As a result, there is currently an imbalance between what a designer can produce and the ability of anyone to create test benches to adequately verify the design. What are needed are more powerful tools to aid in the creation of test benches.

The current state of the art is to provide rather elaborate assistance with waveform editing and HDL creation of test benches, but few tool makers have presented tools that help the test bench creator produce complex tests automatically, rapidly, in volume, and relatively free of error. The graphical means featured by many of today's top-flight EDA tools are simply inadequate to the needs of serious designers of large digital circuits. Waveform editing, no matter how user friendly, cannot produce the volume and quality of tests needed for large circuits. Forcing designers to work with these graphical tools—or, alternatively, requiring the designer to create test stimuli and expected responses using HDL techniques—slows the entire design process. Also, the graphical techniques rely entirely on human intuition to create test stimuli and expected responses.

SUMMARY OF THE INVENTION

The present invention offers a solution to this dilemma. The invention is a test bench creation tool (FIG. 1) that is to be integrated into typical EDA design tool suites, preferably as part of a simulation package. The tool provides a designer with an ability to classify parts of a design using such techniques as special comment lines. Once the parts of a design have been classified in this manner, the tool (or alternatively, the designer) selects pre-existing test bench HDL design templates suitable for the identified circuit classes. These HDL design templates provide much of the boilerplate programming that must exist in any test bench effort. The templates require the tool (or alternatively, the designer) to provide circuit parameters such as bus width, etc. ATPG techniques are available for invocation by the designer to develop tests for combinational logic, and test sequences for sequential logic according to the circuit classifications. The ATPG techniques also create expected responses for use in comparison with actual responses. The tool (or alternatively, the designer) copies the test stimuli and expected responses into the test bench templates to complete the test bench. The completed test benches are applied to the circuits being tested via a simulation tool (FIG. 2).

The ATPG techniques used in manufacturing test are not directly suitable for verification testing and must be modified somewhat to provide useful test bench stimuli. The goal in verification is to demonstrate that the HDL defines a circuit that does what the designer intended it to do, rather than to prove that the HDL does what a fault-free copy of the circuit does—the latter process sometimes called validation.

The test bench should operate in two modes, (1) a functional verification mode in which a few simple tests are applied to give the designer some assurances that the overall structure operates as intended, without too much attention to detail. A second mode (2) applies detailed tests and expected results to prove that there are no hidden surprises in the design.

Waveforms are useful during the functional verification mode because they rapidly give a designer confidence that the circuit is working properly—it is important to remember that the goal here is to bring a very large design up to speed as rapidly as possible.

During the detailed mode of operation, waveform inspection is used only when a designer wants to zero in on a specific area, or when comparison with expected results fails.

There is a fundamental problem here that the present invention does not address: the expected results are derived from an analysis of the HDL, so if there is some subtle error in the HDL it won't be caught by test benches produced in this way. That shortcoming notwithstanding, the present invention is an improvement over much of what is being offered today.

Detailed Description of the Invention

Figure 1:
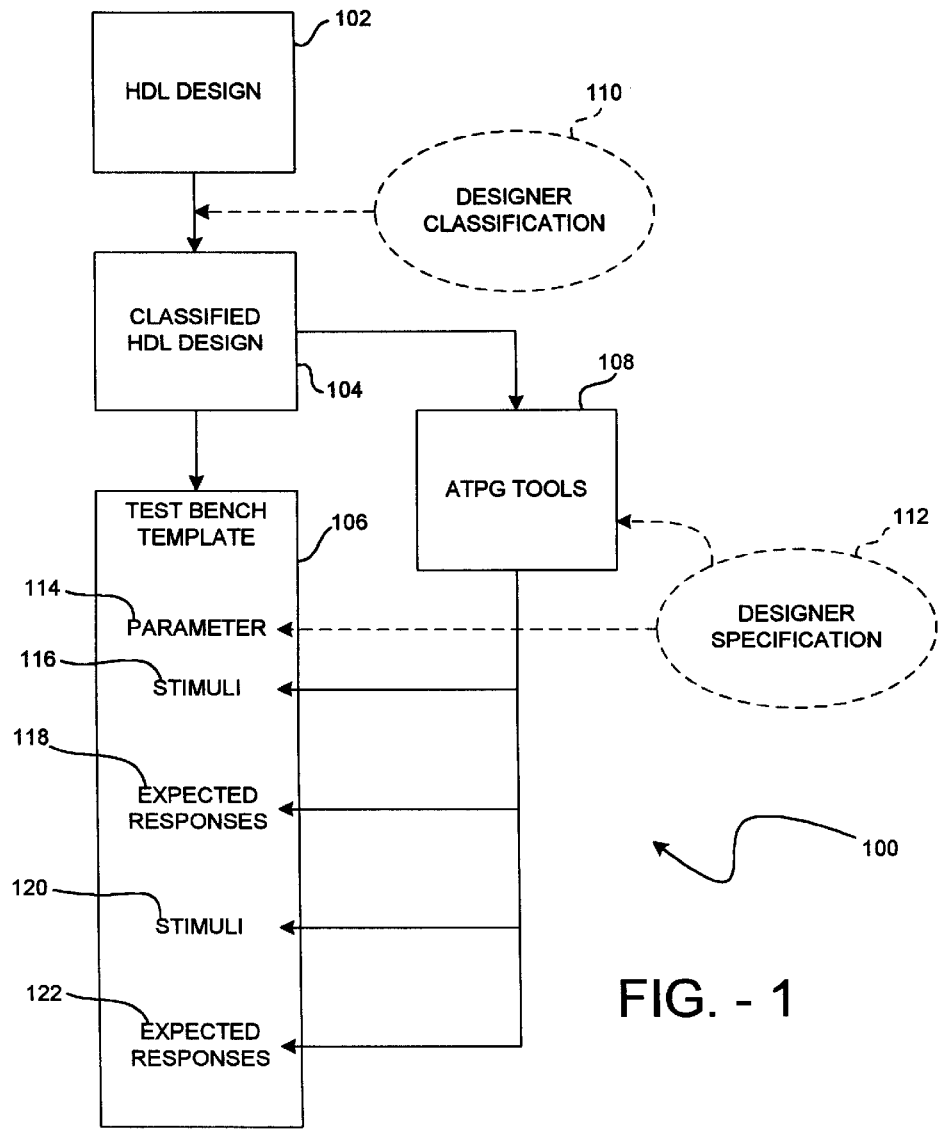
FIG. 1 is a block diagram that illustrates a test bench creation system according to one aspect of the present invention.

FIG. 1 is a block diagram that illustrates a test bench creation system according to one aspect of the present invention. The system is designed generally by the reference numeral 100 and includes an HDL circuit design 102, a classified HDL circuit design 104, a test bench HDL design template 106, ATPG-like tools 108, designer interactions 110, 112, designer-selected parameters 114, and various ATPG-generated test stimuli and expected responses 116–122.

In general, a test bench creation process according to the present invention begins with a completed HDL circuit design 102. If the designer has not already done so, he now classifies 110 the various parts of the design according to circuit type, e.g. finite state machines (FSMs), data paths, counter, and shift registers. The classifications are typically entered directly into the HDL circuit design using special comment lines. The result of the designer intervention 110 is a classified HDL circuit design 104.

The designer now invokes one or more HDL test bench templates 106 that he finds in a template library and brings into a working area for further refinement and modification In many instances the designer at this point will specify parameters within the test bench template 106 that define bus widths, vector lengths, coding types, etc. for the classified HDL circuit design 104. The designer enters these parameters 114 into the test bench template 106.

The designer now causes the HDL circuit design 104 to be compiled to produce a netlist of some sort for use by the ATPG tools 108. The ATPG tools operate on the virtual circuit defined by the netlist to produce test vectors and expected responses for classified portions of the HDL design. The designer incorporates the resulting test vectors and expected responses into the test bench templates by cutting and pasting, or some other means 116–122 to produce completed test benches. In a specific embodiment, the resulting test benches are integrated into standard VLSI test bench creation tools to augment available test bench design techniques.

Figure 2:
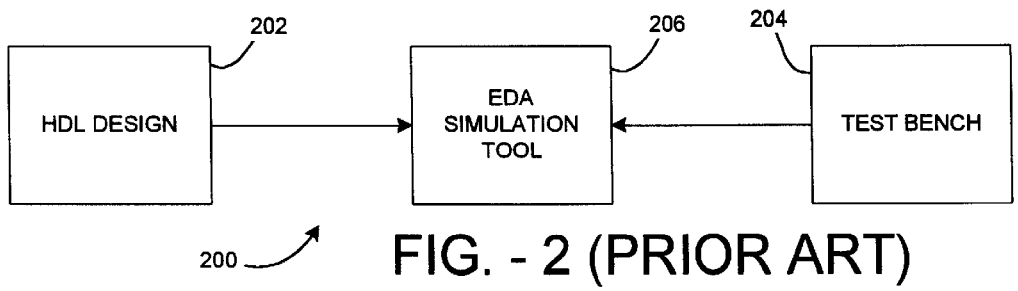
FIG. 2 is a simplified block diagram that illustrates the manner in which a test bench is applied to an HDL design by an EDA simulation tool.

FIG. 2 is a simplified block diagram that illustrates the manner in which a test bench is applied to an HDL design by an EDA simulation tool. The process is designated generally by the reference numeral 200 and includes an HDL circuit design 202, a test bench 204, and an EDA simulation tool 206.

The completed test benches 204 are applied to an EDA simulation tool 206 to test the HDL circuit design 202 by known means. The invention is directed only at the process/system used to create the completed test benches 204.

Tests for functional verification are fairly simple and basically generate waveforms permitting the designer to assure himself that the HDL circuit does essentially what he intended it to do. Very often, boilerplate test bench templates suffice for this level of testing without assistance from ATPG-like processes. Tests for the more detailed phase however must insure that all implemented functions fully operate. Different testing strategies for different types of circuits are commonly used at this level of testing. The circuit classifications made earlier by the designer guide the ATPG-like processes at this point to apply an appropriate testing strategy, e.g. using an adder testing strategy for creating test vectors for an adder, a finite state machine (FSM) testing strategy for creating a test sequence for an FSM, a counter or shift register testing strategy, etc. A finite-state machine (FSM) is tested by insuring that it properly implements a state diagram, moving from one state to the next according to the inputs provided, and generating output signals as appropriate. Insuring that it can count properly and that specific transitions are made without hitch tests a counter. Insuring that specific numeric patterns properly generate sums and carries/borrows, and so forth tests arithmetic units. To a large extent, such specific testing can be controlled by template selection and bus-width specification. ATPG-like processes can assist by exhaustively testing single stuck-at faults and state transitions of a simulator-produced virtual circuit, the circuit used to generate the waveforms in response to test stimuli. An advantage of using a stuck-at fault model for testing an arithmetic unit, for example, is that the model greatly reduces the number of patterns that must be tested.

Another specific embodiment of the invention includes a computer program product including a computer readable medium for directing the computer to perform the steps of a method for creating a test bench, as illustrated in FIG. 1.

While the invention has been described in relation to the embodiments shown in the accompanying Drawing figures, other embodiments, alternatives and modifications will be apparent to those skilled in the art. It is intended that the Specification be exemplary only, and that the true scope and spirit of the invention be indicated by the following claims.

What is claimed is:

1. A method for creating a test bench, comprising the steps of:

providing a circuit design expressed in an HDL;

providing means permitting a circuit designer to classify the various parts of the HDL circuit design using special comment statements;

classifying the parts of the HDL circuit design;

providing a test bench HDL design template library in which each template corresponds to a predetermined circuit classification;

selecting library templates that correspond to classified parts of the HDL circuit design; and merging the selected templates into a master template to form a functional verification test bench for the HDL circuit design.

2. The method as set forth in claim 1, including the additional steps of:

providing a plurality of ATPG tools;

providing a virtual circuit netlist corresponding to the HDL circuit design;

applying the ATPG tools to the netlist to obtain detailed test vectors and test vector sequences for testing selected parts of the classified HDL circuit design; and combining the detailed test vectors and test vector sequences with the functional verification test bench to form a complete verification test bench for the HDL circuit design.

3. The method as set forth in claim 2, further providing means permitting a circuit designer to selectively apply the APTG tools to the netlist to obtain test vectors and vector sequences for combination with the functional verification test bench.

4. The method as set forth in claim 1, wherein the step of merging the selected templates into a master template further includes modifying the selected templates by specifying parameters of the actual circuit.

5. The method as set forth in claim 4, further including providing means permitting a circuit designer to modify the selected templates by specifying parameters of the actual circuit.

6. A test bench creation tool for use with an existing EDA tool, comprising:

means for receiving an HDL circuit design;

means permitting a user to annotate portions of the HDL circuit design to create a design classified by circuit type;

a library of test bench HDL design templates;

each test bench HDL design template defining a functional test for a circuit having a predetermined circuit type classification;

each test bench HDL design template including means for specifying circuit parameters including bus width, vector length, and coding type;

means permitting the user to select test bench HDL design templates from the library corresponding to each classified circuit portion, and to modify the selected templates to include specific parameters of the HDL circuit design; and means permitting the user to merge the selected and modified test bench HDL design templates into a master file to form a functional verification test bench.

7. The test bench creation tool as set forth in claim 6, further including:

a netlist defining a virtual circuit corresponding to the HDL circuit design;

a plurality of ATPG tools;

means permitting the user to selectively apply the ATPG tools to the netlist for obtaining test vectors and vector sequences; and means permitting the user to combine the test vectors and vector sequences with the functional verification test bench to form a complete verification test bench.

8. The test bench creation tool as set forth in claim 7, further including means permitting the user to edit the test vectors and vector sequences.

9. The test bench creation tool as set forth in claim 6, wherein the means permitting the user to merge the selected and modified test bench HDL design templates includes means permitting the user to edit the merged file.

10. A computer program product for use with a computer system, comprising:

a computer readable medium; and means provided on the medium for directing the computer system to perform the following steps, defining a method for creating a verification test bench:

providing a circuit design expressed in an HDL;

providing means permitting a circuit designer to classify the various parts of the HDL circuit design using special comment statements;

classifying the parts of the HDL circuit design;

providing a test bench HDL design template library in which each template corresponds to a predetermined circuit classification;

selecting library templates that correspond to classified parts of the HDL circuit design; and merging the selected templates into a master template to form a functional verification test bench for the HDL circuit design.

11. The computer program product as set forth in claim 10, wherein the means provided on the medium for directing the computer system to perform the steps defining a method for creating a verification test bench, further include:

providing a plurality of ATPG tools;

providing a virtual circuit netlist corresponding to the HDL circuit design;

applying the ATPG tools to netlist to generate detailed test vectors and test vector sequences for the virtual circuit; and combining the test vectors and vector sequences into a complete verification test bench.

12. The computer program product as set forth in claim 11, further providing means permitting a circuit designer to selectively apply the APTG tools to the netlist to obtain test vectors and vector sequences for combination with the functional verification test bench.

13. The computer program product as set forth in claim 10, wherein the step of merging the selected templates into a single file further includes modifying the selected templates by specifying parameters of the actual circuit.

14. The computer program product as set forth in claim 13, further including providing means permitting a circuit designer to modify the selected templates by specifying parameters of the actual circuit.

15. The computer program product as set forth in claim 10, further including means permitting a circuit designer to edit the functional verification test bench.

* * * * *